(12) United States Patent
Kho et al.

(10) Patent No.: US 10,264,698 B2
(45) Date of Patent: Apr. 16, 2019

(54) SYSTEMS AND METHODS FOR MOUNTING ASSEMBLY PULL-HANDLES

(71) Applicant: Facebook, Inc., Menlo Park, CA (US)

(72) Inventors: Chuankeat Kho, San Jose, CA (US); Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/687,406

(22) Filed: Aug. 25, 2017

(65) Prior Publication Data
US 2019/0069431 A1    Feb. 28, 2019

(51) Int. Cl.
| | |
|---|---|
| *H05K 7/14* | (2006.01) |
| *E05B 65/46* | (2017.01) |
| *H05K 7/18* | (2006.01) |
| *H05K 7/20* | (2006.01) |
| *A47B 88/473* | (2017.01) |
| *E05B 1/00* | (2006.01) |

(52) U.S. Cl.
CPC ......... *H05K 7/1489* (2013.01); *A47B 88/473* (2017.01); *E05B 1/0038* (2013.01); *H05K 7/1492* (2013.01); *H05K 7/183* (2013.01); *H05K 7/20172* (2013.01); *E05B 65/46* (2013.01)

(58) Field of Classification Search
None
See application file for complete search history.

(56) References Cited

U.S. PATENT DOCUMENTS

| | | | | |
|---|---|---|---|---|
| 6,181,549 B1 * | 1/2001 | Mills | ............... | H05K 7/1489 |
| | | | | 292/114 |
| 6,469,899 B2 * | 10/2002 | Hastings | ............... | H05K 7/1489 |
| | | | | 248/65 |
| 7,301,778 B1 * | 11/2007 | Fang | ............... | H05K 7/1409 |
| | | | | 312/223.2 |
| 8,944,538 B2 * | 2/2015 | Li | ............... | H05K 7/20172 |
| | | | | 312/223.2 |
| 9,203,188 B1 * | 12/2015 | Siechen | ............... | H01R 13/62994 |
| 9,461,389 B2 * | 10/2016 | Novack | ............... | H05K 7/1411 |
| 9,545,028 B2 * | 1/2017 | Hoshino | ............... | H05K 7/1411 |
| 9,583,877 B1 * | 2/2017 | Angelucci | ............... | G06K 7/00 |
| 9,609,778 B1 * | 3/2017 | Spencer | ............... | G06F 1/183 |

(Continued)

OTHER PUBLICATIONS

Jason David Adrian et al.; Apparatus, System, and Method for Reconfigurable Media-Agnostic Storage; U.S. Appl. No. 15/694,068, filed Sep. 1, 2017.

(Continued)

*Primary Examiner* — Xanthia C Cunningham
(74) *Attorney, Agent, or Firm* — FisherBroyles, LLP

(57) ABSTRACT

The disclosed mounting assembly for mounting information technology modules within an information technology rack may include (1) a support tray coupled to a frame of the information technology rack, (2) a drawer positioned on the support tray that is moveable between an initial position and an extended position within the support tray, and (3) at least one elongate handle, attached to a front panel of the drawer, that includes a button that interacts with a latching mechanism that locks the drawer into the initial position, where (1) when disengaged, the latching mechanism allows the drawer to move into the extended position and (2) the latching mechanism is disengaged when the button is pressed.

20 Claims, 9 Drawing Sheets

(56) References Cited

U.S. PATENT DOCUMENTS

| | | | | |
|---|---|---|---|---|
| 9,795,052 | B2* | 10/2017 | Hsiao | H05K 7/1488 |
| 2005/0238421 | A1* | 10/2005 | Doerr | E05C 19/06 403/322.4 |
| 2006/0134953 | A1* | 6/2006 | Williams | H05K 7/1411 439/157 |
| 2006/0274508 | A1* | 12/2006 | LaRiviere | H05K 7/1488 361/727 |
| 2009/0245745 | A1* | 10/2009 | Krampotich | G02B 6/4455 385/135 |
| 2009/0271950 | A1* | 11/2009 | Wang | E05B 1/0015 16/415 |
| 2009/0274429 | A1* | 11/2009 | Krampotich | G02B 6/4453 385/135 |
| 2010/0296791 | A1* | 11/2010 | Makrides-Saravanos | G02B 6/4455 385/135 |
| 2011/0273850 | A1* | 11/2011 | Chen | H05K 5/0221 361/726 |
| 2011/0309730 | A1* | 12/2011 | Retchloff | E05B 65/46 312/332.1 |
| 2012/0004772 | A1* | 1/2012 | Rahilly | E05B 65/46 700/237 |
| 2012/0020006 | A1* | 1/2012 | Xu | G06F 1/186 361/679.33 |
| 2013/0325183 | A1* | 12/2013 | Rahilly | E05B 65/46 700/275 |
| 2014/0187068 | A1* | 7/2014 | Chia | H05K 7/1489 439/160 |
| 2015/0156912 | A1* | 6/2015 | Liang | H05K 5/0221 361/726 |
| 2015/0163946 | A1* | 6/2015 | Kyle | H05K 7/1421 312/295 |
| 2015/0235673 | A1* | 8/2015 | Lo | G11B 33/022 361/679.34 |
| 2016/0150659 | A1* | 5/2016 | Chen | H05K 7/1487 312/223.2 |
| 2016/0150667 | A1* | 5/2016 | Xu | H05K 7/1489 361/679.4 |
| 2016/0330858 | A1* | 11/2016 | Ehlen | H05K 7/1489 |

OTHER PUBLICATIONS

Jason David Adrian; Apparatus, System, and Method for Indicating the Status of and Securing Hard Drives; U.S. Appl. No. 15/700,112, filed Sep. 9, 2017.

Jason David Adrian; Apparatus, System, and Method for Directing Air in a Storage-System Chassis; U.S. Appl. No. 15/689,650, filed Aug. 29, 2017.

Jason David Adrian et al.; Apparatus, System, and Method for Enabling Multiple Storage-System Configurations; U.S. Appl. No. 15/688,830, filed Aug. 28, 2017.

Jason David Adrian et al.; Apparatus, System, and Method for Securing Hard Drives in a Storage Chassis; U.S. Appl. No. 15/697,405, filed Sep. 6, 2017.

Jason David Adrian; Apparatus, System, and Method for Detecting Device Types of Storage Devices; U.S. Appl. No. 15/698,540, filed Sep. 7, 2017.

Chuankeat Kho et al.; Removeable Drive-Plane Apparatus, System, and Method; U.S. Appl. No. 15/693,362, filed Aug. 31, 2017.

Jason David Adrian; An Apparatus, System, and Method for Reconfiguring Air Flow Through a Chassis; U.S. Appl. No. 15/716,251, filed Sep. 26, 2017.

Jason Adrian; Introducing Bryce Canyon: Our next-generation storage platform; https://code.facebook.com/posts/1869788206569924/introducing-bryce-canyon-our-next-generation-storage-platform/; Mar. 8, 2017.

Jason Adrian et al.; Bryce Canyon Storage Specification; Jan. 31, 2017.

Open Compute Project; http://opencompute.org/; as accessed Sep. 29, 2017.

Jason David Adrian; Data-Center Drawer and Cable Track Assembly; U.S. Appl. No. 15/720,647, filed Sep. 29, 2017.

Bisson; How Facebook Does Storage; https://thenewstack.io/facebook-storage.

What's the Difference Between SATA and SAS Hard Drives?; https://www.pickaweb.co.uk/kb/difference-between-sata-sas-hard-drives/.

Chuankeat Kho; Apparatus, System, and Method for Securing Computing Components to Printed Circuit Boards; U.S. Appl. No. 15/713,607, filed Sep. 23, 2017.

Chuankeat Kho et al.; Apparatus, System, and Method for Partitioning a Storage-System Chassis; U.S. Appl. No. 15/708,069, filed Sep. 18, 2017.

Chuankeat Kho et al.; Apparatus, System, and Method for Dampening Vibrations Generated by Exhaust Fans; U.S. Appl. No. 15/713,609, filed Sep. 23, 2017.

Chuankeat Kho et al.; Apparatus, System, and Method for Resisting Shock to a Data-Center Rack; U.S. Appl. No. 15/708,075, filed Sep. 18, 2017.

Acoustic Attenuation; https://en.wikipedia.org/wiki/Acoustic_attenuation; Oct. 22, 2012.

Electromagnetic Shielding; https://en.wikipedia.org/wiki/Electromagnetic_shielding; May 15, 2016.

* cited by examiner

SYSTEMS AND METHODS FOR MOUNTING ASSEMBLY PULL-HANDLES

BACKGROUND

Data centers typically rely on one or more information technology racks to store various information technology components (e.g., server modules). Often, an information technology rack includes multiple drawers, in which one or more information technology components are mounted. In some cases, a user may pull a drawer partially out and away from an information technology rack to access the information technology components. Because a drawer included in an information technology rack may be large and/or heavy, the process of pulling a drawer out and away from an information technology rack may be difficult and/or cumbersome for a user. As such, the instant disclosure identifies a need for improved systems and methods that facilitate opening drawers positioned within information technology racks.

SUMMARY

As will be described in greater detail below, the instant disclosure describes various systems and methods for a mounting assembly for mounting information technology modules within an information technology rack. In one example, the information technology rack may include (1) a support tray coupled to a frame of the information technology rack, (2) a drawer positioned on the support tray that is moveable between an initial position and an extended position within the support tray, and (3) at least one elongate handle, attached to a front panel of the drawer, that includes a button that interacts with a latching mechanism that locks the drawer into the initial position. When the latching mechanism is disengaged (e.g., in response to the button being pressed), the latching mechanism may allow the drawer to move into the extended position.

In some examples, the initial position may represent an operating position in which the front panel of the drawer is adjacent to the front of the frame and the extended position may represent a service position in which the front panel of the drawer extends beyond the front of the frame. In some examples, the mounting assembly may include two elongate handles. In one example, the two elongate handles may be located in a same horizontal plane of the front panel, separated from one another by a predetermined distance.

In some embodiments, the at least one elongate handle may include (1) an anterior portion configured to be cupped by the non-opposable fingers of the hand of a user and (2) a superior portion that may be cupped by the thumb of the user. In these embodiments, the button may be integrated in the superior portion of the elongate handle such that the button may be depressed by the thumb of the user as the user cups the anterior portion with his or her non-opposable fingers.

In one embodiment, the latching mechanism may, in addition to being disengaged via the button, be disengaged manually by a user. In this embodiment, the module mounting assembly may also include a rotatable service flap covering the latching mechanism and the latching mechanism may be accessed to be manually disengaged when the rotatable service flap is rotated such that the rotatable service flap no longer covers the latch. In some examples, the information technology modules may include a server module, a fan, and/or power-supply equipment.

In some examples, the instant disclosure presents a system that may include a mounting assembly rack with at least one of the features described above. In some examples, the instant disclosure presents methods associated with a mounting assembly used for mounting information technology modules within an information technology rack. For example, a method may include (1) locating a drawer, positioned in a support tray of a mounting assembly that mounts information technology modules within an information technology rack, that is locked into an initial position within the support tray by a latching mechanism that blocks the drawer from moving into an extended position and (2) moving the drawer into the extended position by pressing a button included within an elongate handle that is attached to a front panel of the drawer. In this example, pressing the button may push the button downward such that the button interacts with the latching mechanism, causing the latching mechanism to disengage.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
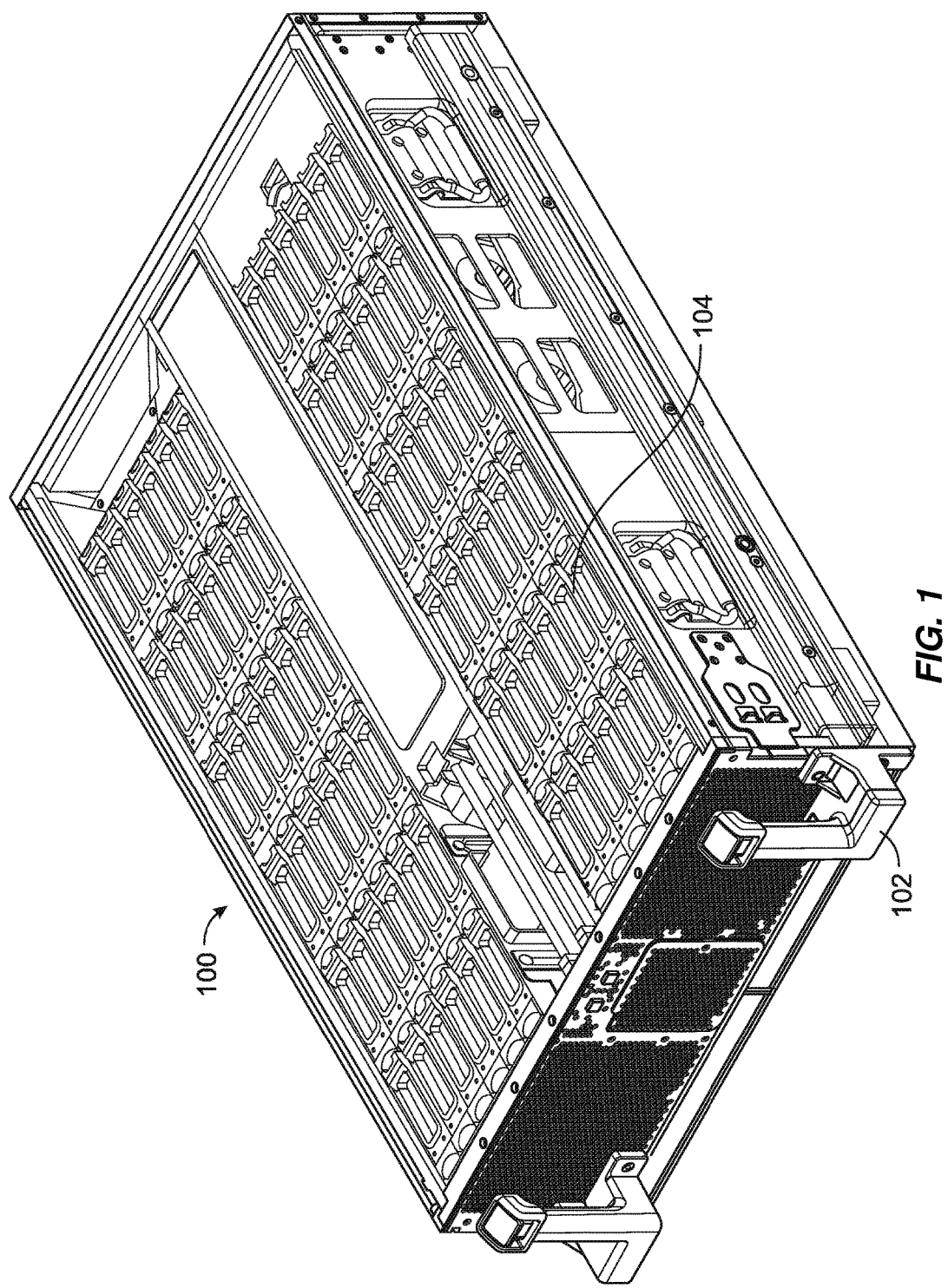
FIG. 1 is a perspective view of a drawer used to store information technology modules.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods associated with an ergonomic pull-handle latching system within a data center drawer positioned in an information technology rack. As will be explained in greater detail below, the pull-handle latching system may include a pull-handle that is easy for a user to grip. In some examples, the handle may include a button on the superior portion of the pull-handle that the user may depress to trigger the unlatching of a latching mechanism so that the drawer may be opened. In one embodiment, the drawer may include a backup service region. In the event of a failure of the pull-handle, the drawer may still be opened by lifting a flap to expose a release mechanism and manually actuating the release mechanism to unlatch the latching mechanism and unlock the drawer. By facilitating the ease with which a user may pull open a data center drawer, the disclosed systems and methods may improve data center work flow.

The following will provide, with reference to FIGS. 1-9, detailed descriptions of a data center mounting assembly that includes a pull-handle latching system. FIG. 1 shows a drawer 100 used to store information technology modules (e.g., information technology module 104). As used herein, the term "drawer" refers to any enclosed or semi-enclosed system chassis used to house information technology modules in a data center. The term "information technology module," as used herein, may refer to any modular device that may include and/or form a part of a computing system. Examples of information technology modules include, without limitation, servers, power equipment (e.g., power shelves), fans, network switches, and battery backup units.

Figure 2:
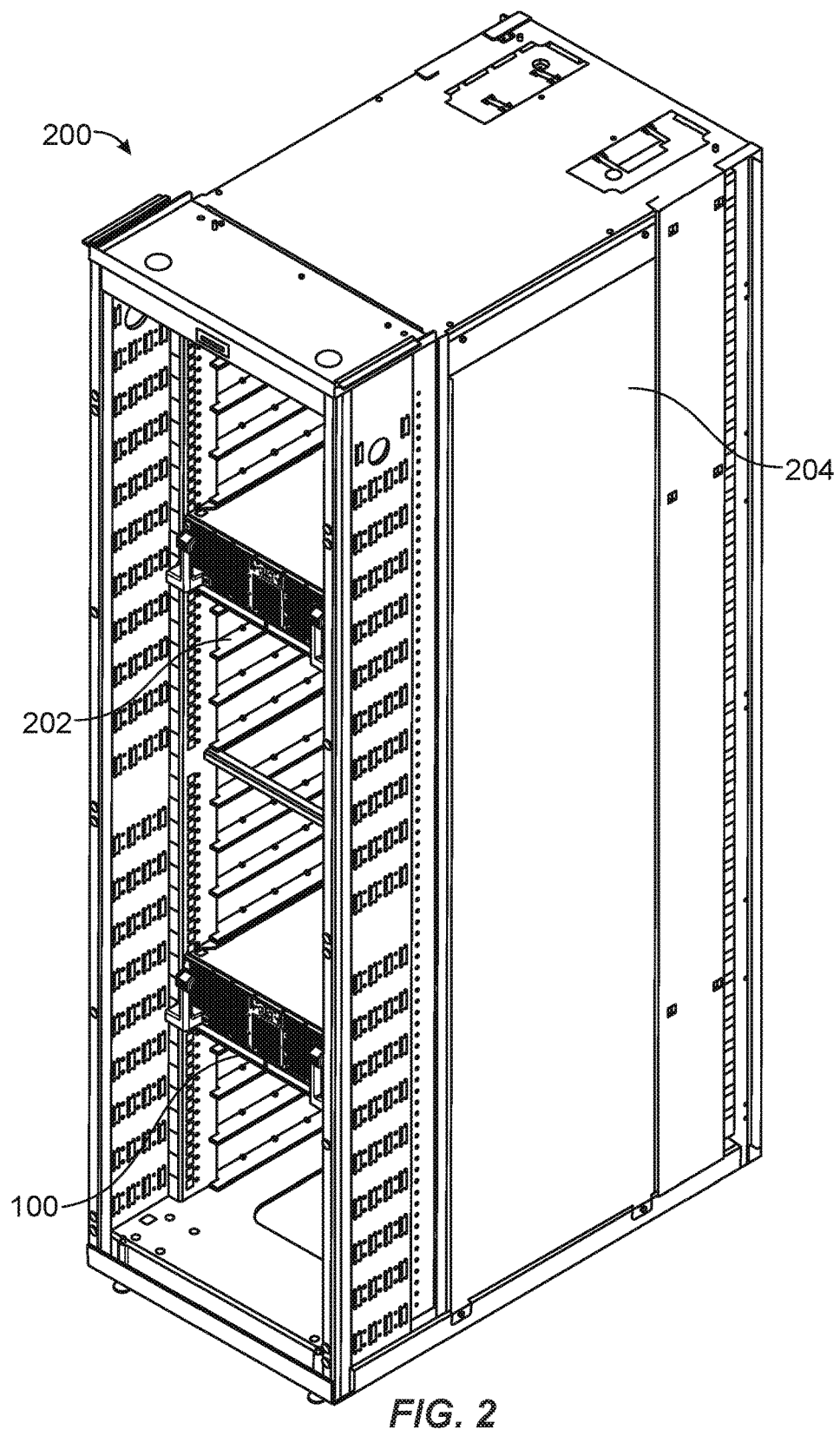
FIG. 2 is a perspective view of a drawer positioned within an information technology rack.

In some examples, drawer 100 may be positioned within an information technology rack. For example, as illustrated in FIG. 2, drawer 100 may be positioned within an information technology rack 200. In one example, drawer 100 may be positioned on a support tray (such as support tray 202) coupled to a frame 204 of information technology rack 200.

As used herein, the term "information technology rack" refers to any multi-system chassis structure for housing multiple information technology modules and/or providing support for one or more cables that connect to information technology modules. In some examples, a heterogeneous set of information technology modules may operate within a single information technology rack. For example, a single information technology rack may connect servers, power supplies, network switches, and/or battery backup units within a computing infrastructure. As used herein, the term "computing infrastructure" may refer to any collection of devices and/or components that may collectively provide computational resources. A computing infrastructure, as described herein, may be used in any of a variety of contexts. In some examples, a computing infrastructure may provide computation in a cloud computing environment. Additionally or alternatively, a computing infrastructure may provide computation in a parallel computing environment. In some examples, a computing infrastructure may represent a collection of underlying physical computing resources that may be allocated and/or virtualized to provide one or more logical and/or virtual computing resources.

Figure 3:
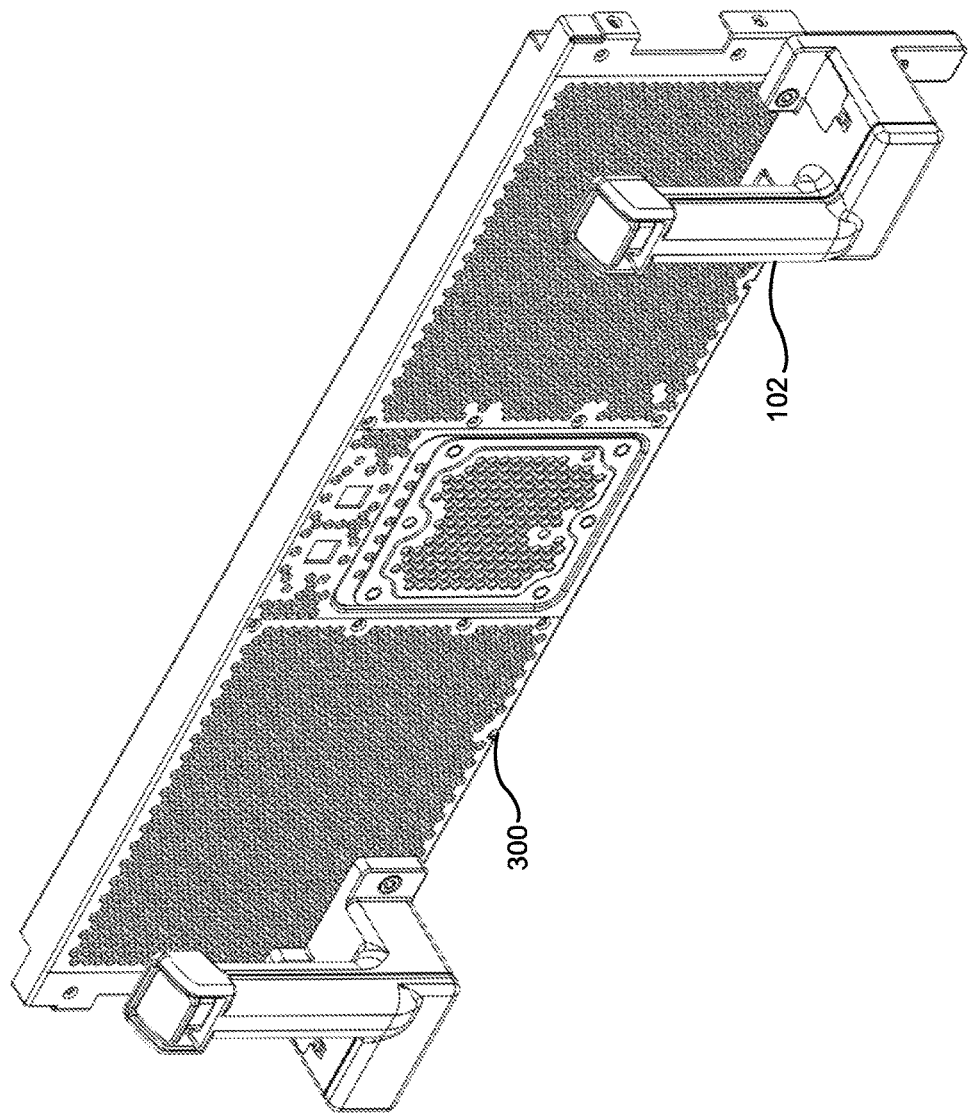
FIG. 3 is a perspective view of a front panel of a drawer used in a mounting assembly for mounting information technology modules within an information technology rack.
Figure 4:
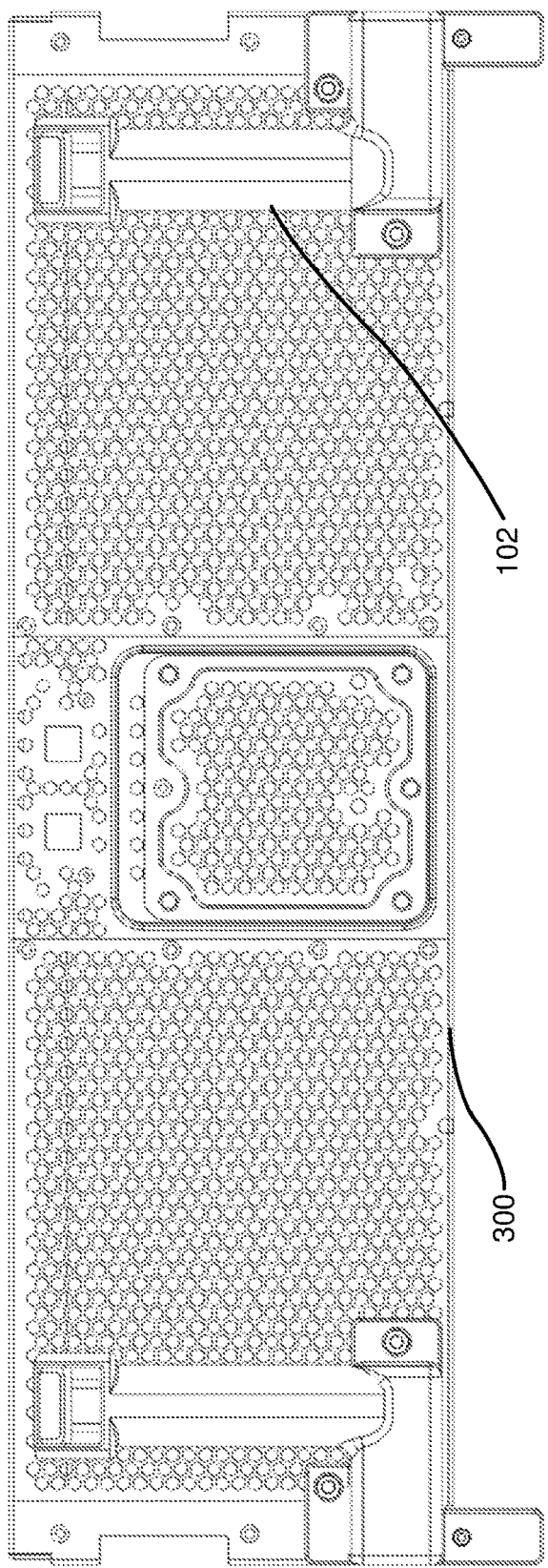
FIG. 4 is a front view of a front panel of a drawer used in a mounting assembly for mounting information technology modules within an information technology rack.

Returning to FIG. 1, drawer 100 may include one or more elongate handles, such as elongate handle 102. As used herein, the term "elongate handle" generally refers to any type or form of handgrip that is long relative to its width such that the handgrip may be cupped by a user's hand. In some examples, elongate handle 102 may be attached to a front panel of drawer 100. For example, as shown in FIGS. 3-4, elongate handle 102 may be attached to a front panel 300. In some examples, as shown in FIGS. 1-4 and 6-8, drawer 100 may include two elongate handles. In these examples, the two elongate handles may be located in the same horizontal plane of front panel 300, separated from one another by a predetermined distance. In one example, the distance between the two elongate handles may facilitate a user simultaneously cupping a left elongate handle with his or her left hand and a right elongate handle with his or her right hand, as illustrated in FIG. 7. In some examples, the two elongate handles may each be angled inwards toward one another, creating a more ergonomic grip for a user cupping the two elongate handles. In other examples, as shown in FIGS. 1-4 and 6-8, the two elongate handles may be parallel to one another.

Elongate handle 102 may include a variety of elements. For example, as illustrated in FIGS. 5A-5D, elongate handle 102 may include an anterior portion 502 and a superior portion 504 that includes a button 506. In one embodiment, as shown in FIG. 7, anterior portion 502 may be configured to be cupped by the non-opposable fingers of the hand of the user. In this embodiment, superior portion 504 may be configured to be cupped by the thumb of the user and button 506 may be integrated into superior portion 504 such that button 506 may be depressed by the thumb of the user as the user cups anterior portion 502 with his or her non-opposable fingers.

In some examples, a physical area of button 506 may be larger than the physical area of the surface of a user's thumb to facilitate the ease with which a user may depress button 506 using his or her thumb. In one such example, the physical area of button 506 may be determined based on thumb-size measurements collected from a variety of users. For example, the physical area of button 506 may be based on thumb-size measurements obtained from a test group and/or from a database of thumb-size measurements. In some examples, the physical area of button 506 may correspond to the thumb-size of an average user. In other examples, the physical area of button 506 may be designed to accommodate a range of thumb sizes.

Similarly, a physical length of anterior portion 502 may be based on a physical width of a user's hand so that button 506 is easy for a user to reach using his or her thumb while cupping anterior portion 502 with his or her non-opposable fingers. In one such example, the physical length of anterior portion 502 may be determined based on hand-size measurements collected from a variety of users (e.g., from a test group of users and/or from a database of hand-size measurements). In some examples, the physical length of anterior portion 502 may correspond to the hand-width of an average user. In other examples, the physical length of anterior portion 502 may be designed to accommodate a range of hand-widths.

In some examples, as will be discussed in greater detail below, elongate handle 102 may also include a disengaging element 508 that may disengage a latching mechanism when button 506 is pressed. Additionally, as will also be discussed in greater detail below, elongate handle 102 may include a rotatable service flap 510 through which disengaging element 508 may be accessed (e.g., as an alternative to accessing disengaging element 508 indirectly via button 506).

Figure 6:
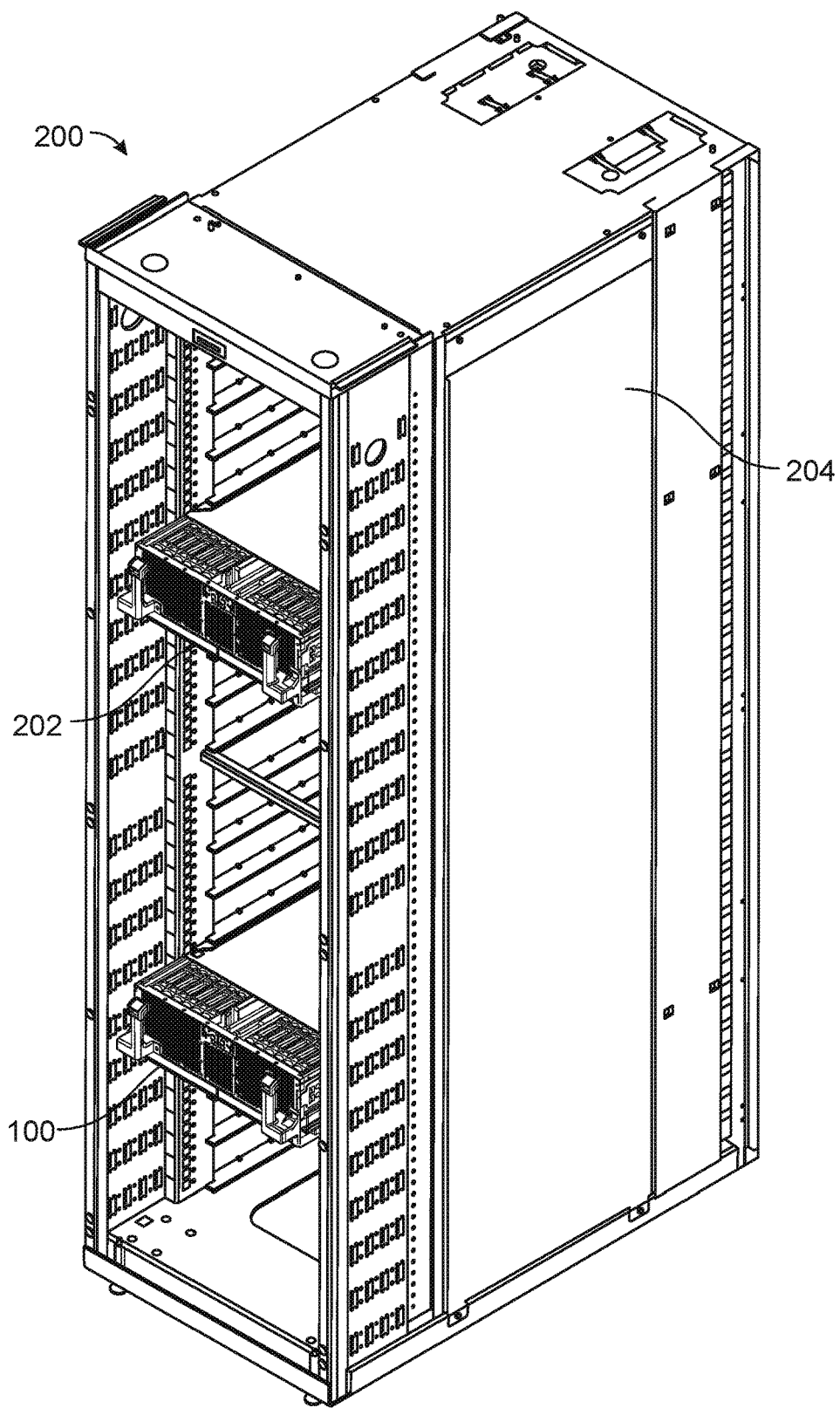
FIG. 6 is a perspective view of an extended drawer positioned within an information technology rack.
Figure 7:
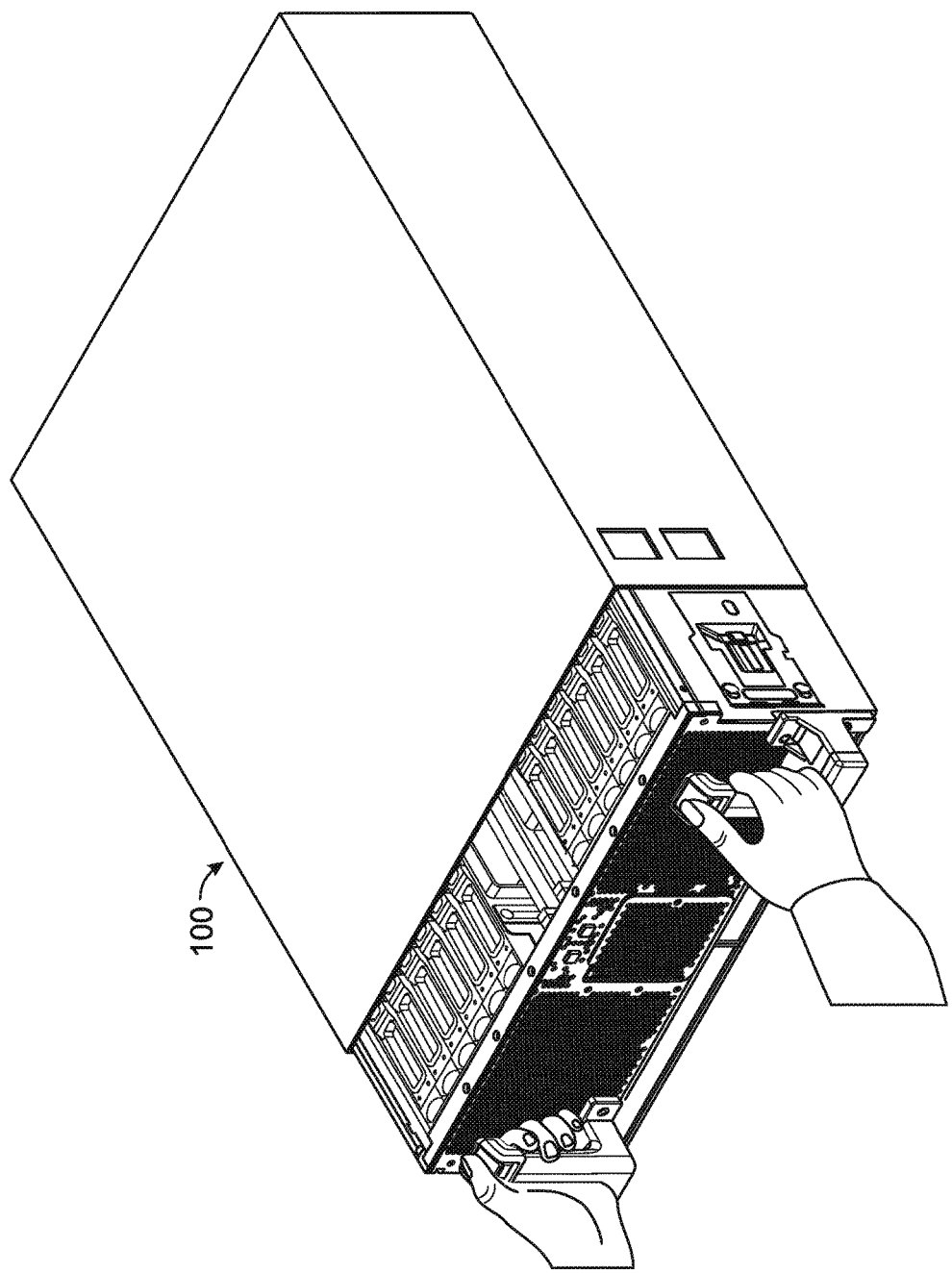
FIG. 7 is an additional perspective view of an extended drawer used to store information technology modules being extended by a user.

In some examples, as illustrated in FIGS. 2 and 6-7, drawer 100 may be moveable between an initial position (illustrated in FIG. 2) and an extended position (illustrated in FIGS. 6-7) within support tray 202. In one embodiment, the initial position may represent an operating position in which front panel 300 of drawer 100 is adjacent to a front of frame 204, as illustrated by the position of drawer 100 in FIG. 2. In this embodiment, the extended position may represent a service position (e.g., used when a user such a technician is accessing an information technology module mounted within drawer 100) in which front panel 300 of drawer 100 extends beyond the front of frame 204, as illustrated by the position of drawer 100 in FIGS. 6-7.

Figure 8:
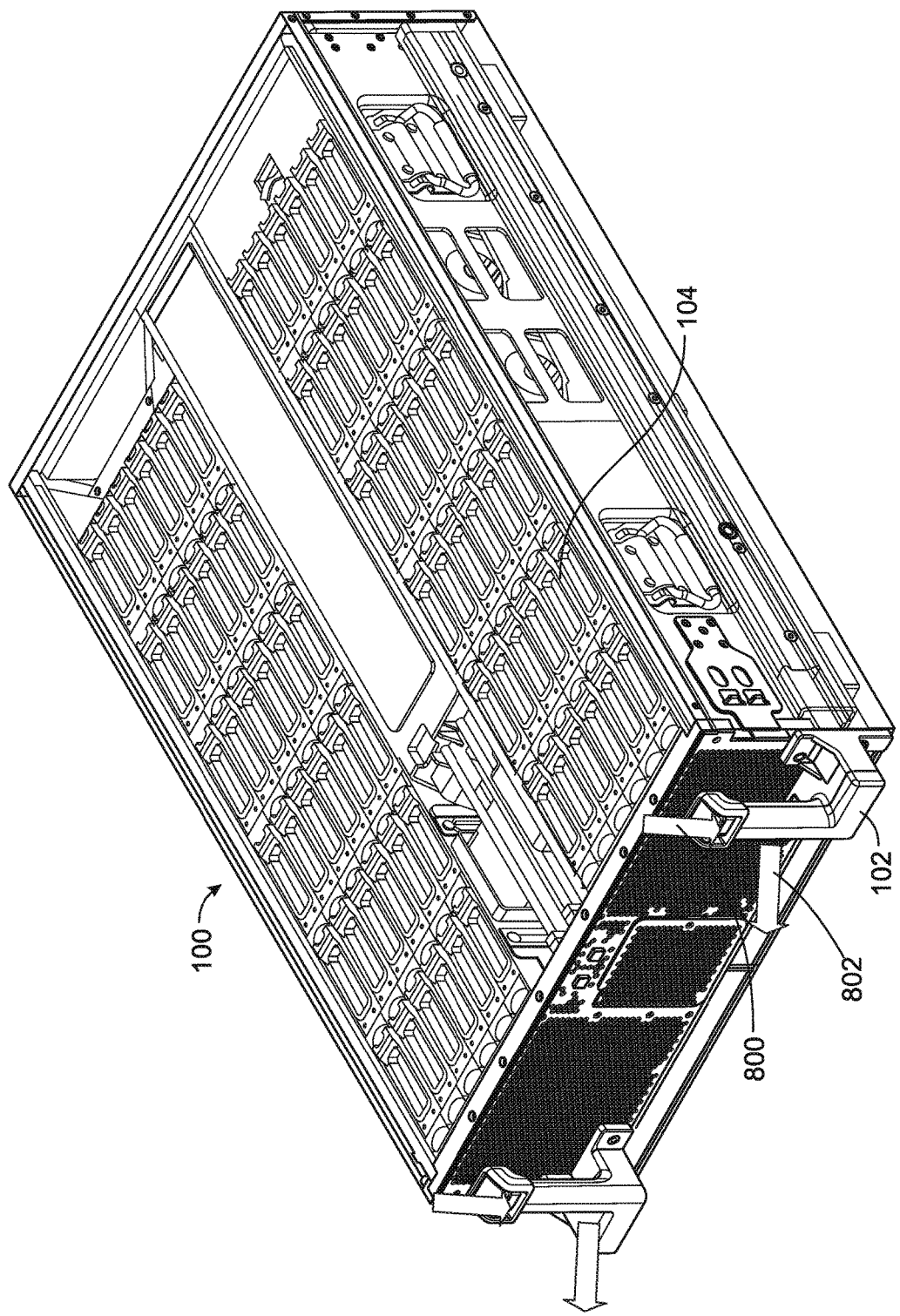
FIG. 8 is a perspective view of a drawer that illustrates the direction in which buttons included within handles of the drawer may be pressed to pull open the drawer.

In some examples, drawer 100 may be locked into the initial position by a latching mechanism that blocks drawer 100 from moving into the extended position. In these examples, drawer 100 may be moved into the extended position by disengaging the latching mechanism to unlock the drawer. In one example, as illustrated in FIG. 8, a user may disengage the latching mechanism and move drawer 100 into the extended position by (1) standing in front of information technology rack 200, (2) cupping elongate handle 102, (3) pressing downward on button 506 in the direction illustrated by arrow 800, and (4) pulling on elongate handle 102 in the direction illustrated by arrow 802.

Figure 9:
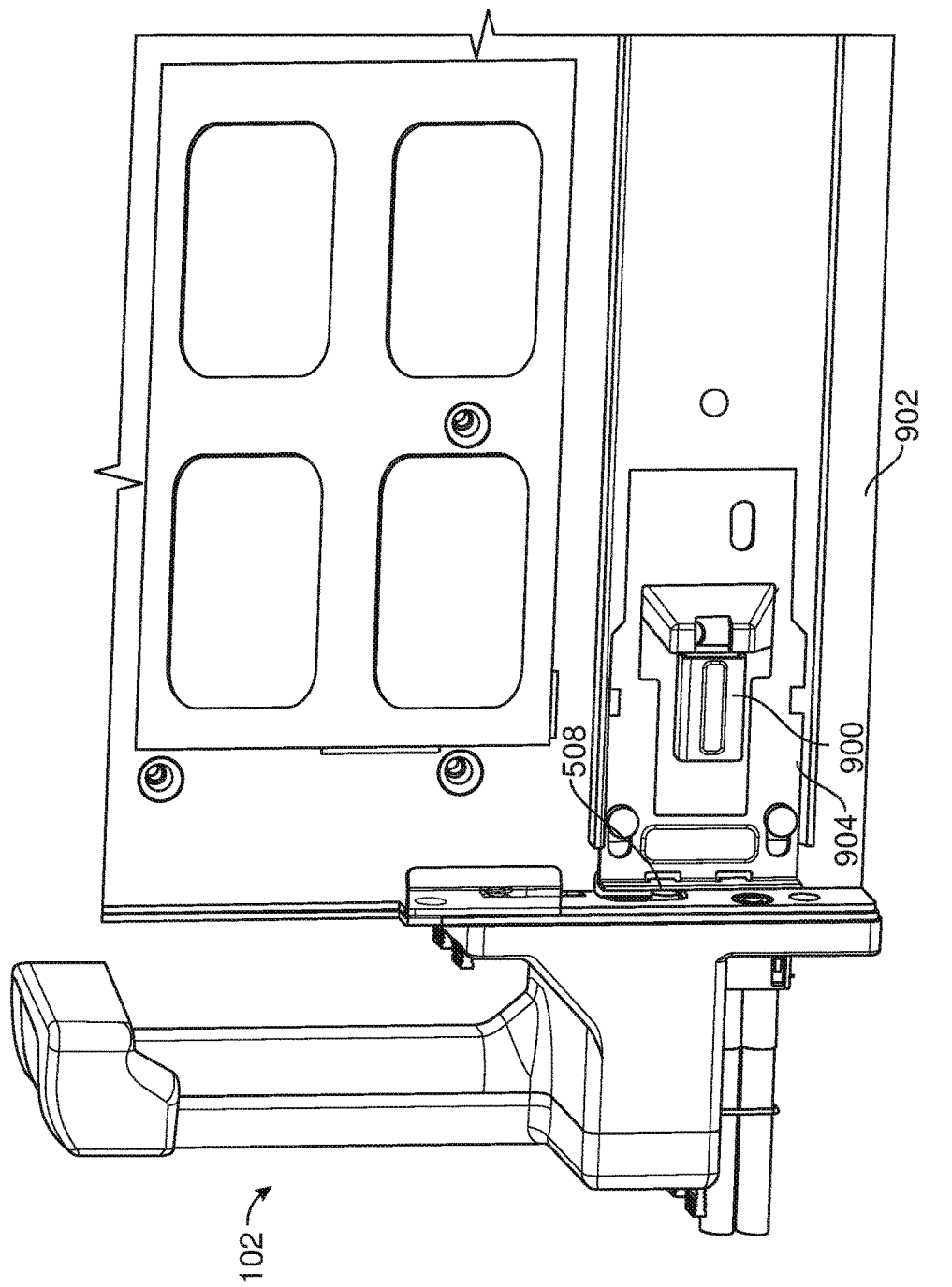
FIG. 9 is a perspective view of a latch mechanism within a mounting assembly for mounting information technology modules within an information technology rack.

FIG. 9 illustrates one embodiment of a latching mechanism for locking drawer 100 into the initial position. As shown in FIG. 9, the latching mechanism may include a suppressible element 900 attached to a side panel 902 of drawer 100 that extends out from side panel 902 such that the surface of suppressible element 900 extends out farther than the surface of side panel 902. The latching mechanism may also include a sliding element 904 that may be slid in the direction of suppressible element 900 until it comes in contact with and/or covers suppressible element 900, causing suppressible element 900 to be suppressed such that the surface of suppressible element 900 becomes adjacent to the surface of side panel 902. This action may unlock the locking mechanism, allowing drawer 100 to extend into the extended position.

In some examples, button 506 may interact with the latching mechanism such that the latching mechanism is disengaged. Using FIG. 9 again as an example, button 506 may, when depressed, cause disengaging element 508 to extend in the direction of sliding element 904 until disengaging element 508 pushes sliding element 904 in the direction of suppressible element 900. In this example, disengaging element 508 may push sliding element 904 until sliding element 904 makes contact with and/or covers suppressible element 900. In one embodiment, button 506 may be attached to a series of springs that is also attached to disengaging element 508. In this embodiment, button 506 may, when pressed, apply pressure on the series of springs, which will in turn apply pressure on disengaging element 508, causing disengaging element 508 to extend in the direction of sliding element 904. In these examples, the user may depress button 506 to unlock drawer 100 from its initial position and then pull drawer 100 toward himself or herself in order to extend drawer 100 into an extended position.

Figure 5A:
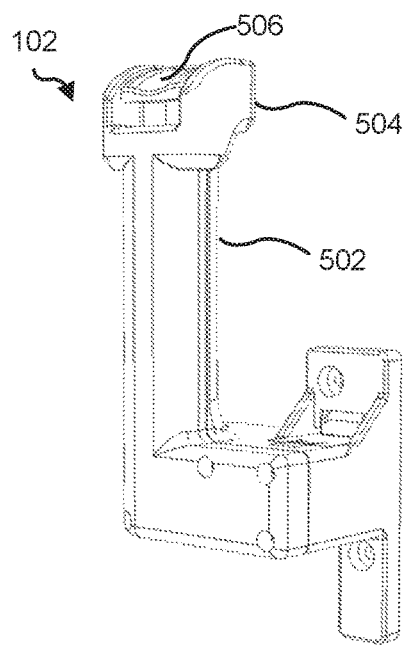
FIGS. 5A-5C are various perspective views of an elongate handle used to pull open a drawer used in a mounting assembly for mounting information technology modules within an information technology rack.
Figure 5B:
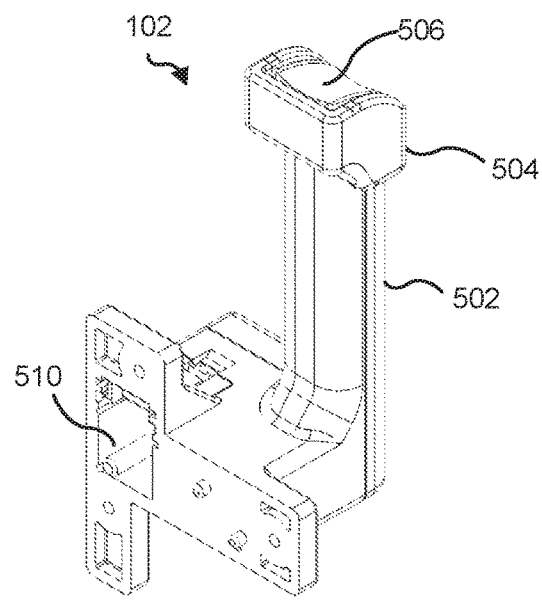
Figure 5C:
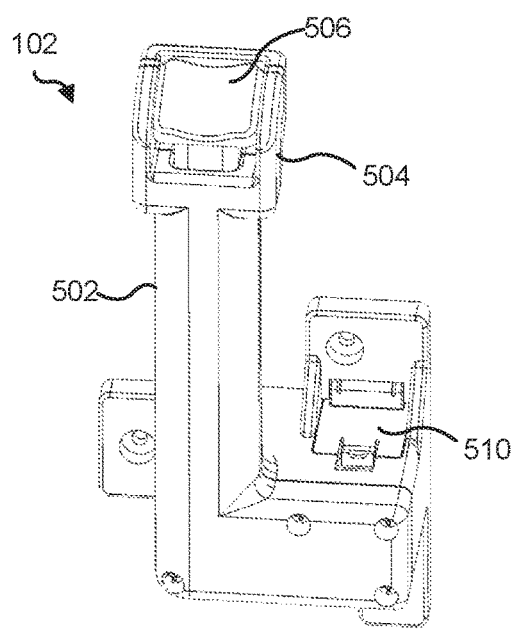
Figure 5D:
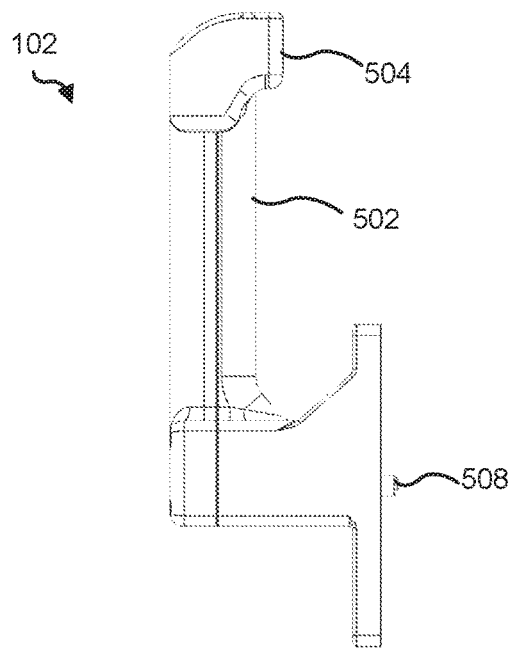
FIG. 5D is a side view of an elongate handle used to pull open a drawer used in a mounting assembly for mounting information technology modules within an information technology rack.

In some examples, drawer 100 may also include a mechanism for manually disengaging the latching mechanism so that a user may manually disengage the latching mechanism if elongate handle 102 is damaged and/or broken off from drawer 100. For example, as shown in FIG. 5C, elongate handle 102 may include rotatable service flap 510, which may cover disengaging element 508. In this example, disengaging element 508 may be accessed when the rotatable service flap is rotated such that the rotatable service flap no longer covers disengaging element 508. Then, disengaging element 508 may be manually pushed, causing disengaging element 508 to extend in the direction of sliding element 904.

In one example, the instant disclosure may include a system that includes a mounting assembly with at least one of the features discussed above (e.g., an elongate handle that includes a button that interacts with a latching mechanism that locks a drawer into an initial position). In some embodiments, a method for manufacturing, assembling, using, adjusting, or otherwise configuring or creating the systems described herein may include (1) locating a drawer, positioned in a support tray of a mounting assembly that mounts information technology modules within an information technology rack, that is locked into an initial position within the support tray by a latching mechanism that blocks the drawer from moving into an extended position and (2) moving the drawer into the extended position by pressing a button included within an elongate handle that is attached to a front panel of the drawer, where pressing the button pushes the button downward such that the button interacts with the latching mechanism, causing the latching mechanism to disengage.

As discussed throughout the instant disclosure, the disclosed methods, systems, and devices may provide one or more advantages over traditional mounting assemblies for mounting information technology modules in data centers. For example, by providing handles on the front panel of a data center drawer that may be cupped by the hands of a user attempting to open the drawer, the instant disclosure may provide an ergonomic design that increases the comfort with which a user may open the drawer. In some examples, the disclosed systems and methods may further facilitate opening data center drawers by including buttons in a superior portion of drawer-handles that a user may depress to unlock a drawer locking-mechanism. In some examples, the size of the drawer-handles and/or the handle-buttons may be based on hand-size and/or thumb-size measurements collected from a variety of users to increase the comfort with which the drawer-handles may be cupped and/or the handle-buttons may be depressed by users.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A mounting assembly for mounting information technology modules within an information technology rack, the mounting assembly comprising:
   a support tray coupled to a frame of the information technology rack;
   a drawer positioned on the support tray that is moveable between an initial position and an extended position within the support tray; and
   at least one elongate handle, attached to a front panel of the drawer, comprising:
      an anterior portion configured to be encompassed by a user's non-opposable fingers;
      a superior portion, positioned above the anterior portion, configured to be cupped by the user's thumb; and
      a button that interacts with a corresponding latching mechanism that locks the drawer into the initial position, wherein:
         when disengaged, the latching mechanism allows the drawer to move into the extended position;
         the latching mechanism is disengaged when the button is pressed; and
         the button is integrated in the superior portion such that the button may be pressed by the user's thumb as the user encompasses the anterior portion with the user's non-opposable fingers and cups the superior portion with the user's thumb.

2. The mounting assembly of claim 1, wherein:
   the initial position comprises an operating position in which the front panel of the drawer is adjacent to a front of the frame; and
   the extended position comprises a service position in which the front panel of the drawer extends beyond the front of the frame.

3. The mounting assembly of claim 1, wherein the latching mechanism may, in addition to being disengaged via the button, be disengaged manually by a user.

4. The mounting assembly of claim 3, further comprising a rotatable service flap covering the latching mechanism, wherein the latching mechanism may be accessed to be manually disengaged when the rotatable service flap is rotated such that the rotatable service flap no longer covers the latching mechanism.

5. The mounting assembly of claim 1, wherein the information technology modules comprise at least one of:
   a server module;
   a fan; or
   power-supply equipment.

6. The mounting assembly of claim 1, wherein the at least one elongate handle comprises two elongate handles.

7. The mounting assembly of claim 6, wherein the two elongate handles comprise a first elongate handle, configured to be encompassed using the user's left hand, and a second elongate handle, configured to be encompassed using the user's right hand.

8. The mounting assembly of claim 6, wherein the two elongate handles are located in a same horizontal plane of the front panel, separated from one another by a predetermined distance.

9. A system comprising a mounting assembly for mounting information technology modules within an information technology rack, the mounting assembly comprising:
   a support tray coupled to a frame of the information technology rack;
   a drawer positioned on the support tray that is moveable between an initial position and an extended position within the support; and
   at least one elongate handle, attached to a front panel of the drawer, comprising:
      an anterior portion configured to be encompassed by a user's non-opposable fingers;
      a superior portion, positioned above the anterior portion, configured to be cupped by the user's thumb; and
      a button that interacts with a corresponding latching mechanism that locks the drawer into the initial position, wherein:
         when disengaged, the latching mechanism allows the drawer to move into the extended position;
         the latching mechanism is disengaged when the button is pressed; and
         the button is integrated in the superior portion such that the button may be pressed by the user's thumb as the user encompasses the anterior portion with the user's non-opposable fingers and cups the superior portion with the user's thumb.

10. The system of claim 9, wherein:
    the initial position comprises an operating position in which the front panel of the drawer is adjacent to a front of the frame; and
    the extended position comprises a service position in which the front panel of the drawer extends beyond the front of the frame.

11. The system of claim 9, wherein the latching mechanism may, in addition to being disengaged via the button, be disengaged manually by a user.

12. The system of claim 11, wherein the mounting assembly further comprises a rotatable service flap covering the latching mechanism, wherein the latching mechanism may be accessed to be manually disengaged when the rotatable service flap is rotated such that the rotatable service flap no longer covers the latching mechanism.

13. The system of claim 9, wherein the information technology modules comprise at least one of:
    a server module;
    a fan; or
    power-supply equipment.

14. The system of claim 9, wherein the at least one elongate handle comprises two elongate handles.

15. The system of claim 14, wherein the two elongate handles are located in a same horizontal plane of the front panel, separated from one another by a predetermined distance.

16. The system of claim 14, wherein the two elongate handles comprise a first elongate handle, configured to be encompassed using the user's left hand, and a second elongate handle, configured to be encompassed using the user's right hand.

17. A method comprising:
    locating a drawer, positioned in a support tray of a mounting assembly that mounts information technology modules within an information technology rack, that is locked into an initial position within the support tray by a latching mechanism that blocks the drawer from moving into an extended position; and
    moving the drawer into the extended position by pressing a button included within an elongate handle that is attached to a front panel of the drawer, wherein:
       the elongate handle comprises an anterior portion configured to be encompassed by a user's non-opposable fingers and a superior portion, positioned above the anterior portion, configured to be cupped by the user's thumb such that the button may be pressed by the user's thumb as the user encompasses the anterior portion with the user's non-opposable fingers and cups the superior portion with the user's thumb; and pressing the button pushes the button downward such that the button interacts with the latching mechanism, causing the corresponding mechanism to disengage.

18. The method of claim 17, wherein:
the initial position comprises an operating position in which the front panel of the drawer is adjacent to a front of a frame of the information technology rack; and
the extended position comprises a service position in which the front panel of the drawer extends beyond the front of the frame.

19. The method of claim 17, wherein the information technology modules comprise at least one of:
a server module;
a fan; or
power-supply equipment.

20. The method of claim 17, wherein the latching mechanism may, in addition to being disengaged via the button, be disengaged manually by a user.

* * * * *